(12) United States Patent
Blonigan et al.

(10) Patent No.: US 7,641,247 B2
(45) Date of Patent: Jan. 5, 2010

(54) END EFFECTOR ASSEMBLY FOR SUPPORTING A SUBSTRATE

(75) Inventors: Wendell T. Blonigan, Union City, CA (US); Takayuki Matsumoto, Santa Clara, CA (US); William N. Sterling, Santa Clara, CA (US); Billy C. Leung, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 354 days.

(21) Appl. No.: 10/321,826

(22) Filed: Dec. 17, 2002

(65) Prior Publication Data
US 2004/0113444 A1 Jun. 17, 2004

(51) Int. Cl.
*B25J 15/00* (2006.01)
*B65G 49/07* (2006.01)

(52) U.S. Cl. ........................ 294/1.1; 294/902; 414/941

(58) Field of Classification Search ................. 294/1.1, 294/64.1, 902; 414/941; 901/41
See application file for complete search history.

(56) References Cited

U.S. PATENT DOCUMENTS

| | | | | |
|---|---|---|---|---|
| 4,848,814 | A | 7/1989 | Suzuki et al. ................ 294/1.1 |
| 5,374,147 | A * | 12/1994 | Hiroki et al. ............. 414/752.1 |
| 5,445,486 | A * | 8/1995 | Kitayama et al. ............ 294/1.1 |
| 5,788,304 | A | 8/1998 | Korn et al. ................... 294/159 |
| 5,955,858 | A * | 9/1999 | Kroeker et al. .............. 414/729 |
| 6,011,627 | A | 1/2000 | Mulligan et al. |
| 6,062,241 | A * | 5/2000 | Tateyama et al. .......... 294/64.1 |
| 6,077,026 | A * | 6/2000 | Shultz ....................... 294/64.1 |
| 6,158,951 | A * | 12/2000 | Carr et al. ................... 414/937 |
| 6,203,617 | B1 * | 3/2001 | Tanoue et al. ............... 118/695 |
| 6,213,704 | B1 | 4/2001 | White et al. ................ 414/217 |
| 6,256,555 | B1 | 7/2001 | Bacchi et al. ............... 700/245 |
| 6,257,827 | B1 | 7/2001 | Hendrickson et al. ....... 414/805 |
| 6,322,116 | B1 * | 11/2001 | Stevens ..................... 294/64.3 |
| 6,322,312 | B1 * | 11/2001 | Sundar ........................ 294/104 |
| 6,371,716 | B1 | 4/2002 | Byun et al. ............. 414/416.03 |
| 6,409,463 | B1 * | 6/2002 | Croft et al. .................. 414/941 |
| 6,413,153 | B1 * | 7/2002 | Molar ......................... 451/259 |
| 6,537,011 | B1 * | 3/2003 | Wang et al. ................. 414/941 |
| 6,572,320 | B2 * | 6/2003 | Davis ...................... 294/119.1 |

(Continued)

FOREIGN PATENT DOCUMENTS

JP 05-090381 4/1993

(Continued)

OTHER PUBLICATIONS

Second Office Action for Chinese Patent Application No. 200380106423.1 dated Sep. 7, 2007.

(Continued)

*Primary Examiner*—Paul T. Chin
(74) *Attorney, Agent, or Firm*—Patterson & Sheridan LLP

(57) ABSTRACT

Generally, an end effector assembly for a substrate transfer robot is provided. In one embodiment, an end effector assembly for supporting a quadrilateral substrate during substrate transfer includes an end effector having an inner edge support disposed on a first end and a first outer edge support disposed on a distal end. The first end of the end effector is adapted for coupling to a robot linkage. The first inner edge support has a face that is oriented parallel to and facing the face of the first outer edge support. This configuration of edge supports captures the substrate to the end effector thereby minimizing substrate slippage during transfer. In another embodiment, lateral guides may be utilized to further enhance capturing the substrate along the edges of the substrate open between the inner and outer edge supports.

30 Claims, 10 Drawing Sheets

U.S. PATENT DOCUMENTS

| | | | |
|---|---|---|---|
| 6,629,883 B2 * | 10/2003 | Katsuoka et al. | 451/332 |
| 6,634,686 B2 * | 10/2003 | Hosokawa | 294/1.1 |
| 6,708,965 B2 * | 3/2004 | Nuxoll et al. | 269/118 |
| 2002/0066330 A1 | 6/2002 | Namba et al. | 74/490.01 |
| 2003/0130759 A1 * | 7/2003 | Kesil et al. | 700/190 |

FOREIGN PATENT DOCUMENTS

| | | |
|---|---|---|
| JP | 06-127621 | 5/1994 |
| JP | 07-193114 | 7/1995 |
| JP | 08-306761 | 11/1996 |
| JP | 08-313856 | 11/1996 |
| JP | 10-095529 | 4/1998 |
| JP | 11-168129 | 6/1999 |
| JP | 11-340302 | 12/1999 |
| JP | 2001-1217296 | 8/2001 |
| JP | 2002-299405 * | 10/2002 |
| TW | 494842 | 7/2002 |
| WO | WO-96/42108 | 12/1996 |
| WO | WO 02/05326 | 1/2002 |

OTHER PUBLICATIONS

Notice of Reasons for Rejection dated Mar. 17, 2009 for Japanese Patent Application No. 2004-563625.

Decision of Patent Examination, Intellectual Property Office, May 28, 2007, Ministry of Economic Affairs, R.O.C.

Chinese Abstract of Taiwan Patent No. 121123, Published Oct. 21, 1989.

Chinese Abstract of Taiwan Patent No. 494842, Published Jul. 11, 2002.

* cited by examiner

END EFFECTOR ASSEMBLY FOR SUPPORTING A SUBSTRATE

BACKGROUND OF THE INVENTION

1. Field of the Invention

Embodiments of the invention relate to an end effector assembly for supporting substrates.

2. Background of the Related Art

Thin film transistors (TFTs) are conventionally made on large glass substrates or plates for use in monitors, flat panel displays, solar cells, personal digital assistants (PDAs), cell phones and the like. TFTs are made in a cluster tool by sequential deposition of various films including amorphous silicon, doped and undoped silicon oxides, silicon nitride and the like in vacuum chambers typically disposed around a central transfer chamber. Production of good quality polysilicon precursor films utilized in these structures requires that the hydrogen content of the film be controlled below about 1 percent. In order to achieve this low hydrogen content, post deposition heat treatment of the film at temperatures of about 550 degrees Celsius is required.

Accordingly, robots utilized to move substrates in these cluster tools must have end effectors designed to withstand these high temperatures. Generally, conventional transfer robots are not suited for operation at such high temperatures. Particularly, the end effectors of vacuum robots utilized in flat panel processing systems typically include one or more rubber friction pads upon which the substrates rest. The friction pads generally prevent the substrate from sliding relative to the end effector as the robot transfers the substrate from chamber to chamber. Several high temperature rubber compounds are available but are typically limited to a maximum operating temperature of about 320 degrees Celsius, significantly lower than the 550 degrees Celsius desired in polysilicon heat treating processes. When the end effector of the robot is exposed to high temperature for more than ten seconds, these conventional rubber pads typically melt and stick to the substrate. The melted rubber stuck to the backside of the substrate is undesirable both due to potential contamination and subsequent processing issues. Moreover, once the rubber pad is removed from the end effector, scratching of the backside of the substrate by the end effector may occur which may lead to particulate generation and substrate damage or breakage. Furthermore, if the rubber pad melts, replacement of the pad is difficult.

Therefore, there is a need for an end effector suitable for use at elevated temperatures.

SUMMARY OF THE INVENTION

In one aspect of the invention, an end effector assembly for a substrate transfer robot is provided. Generally, an end effector assembly for a substrate transfer robot is provided. In one embodiment, an end effector assembly for supporting a quadrilateral substrate during substrate transfer includes an end effector having an inner edge support disposed on a first end and a first outer edge support disposed on a distal end. The first end of the end effector is adapted for coupling to a robot linkage. The first inner edge support has a face that is oriented parallel to and facing the face of the first outer edge support. This configuration of edge supports captures the substrate to the end effector thereby minimizing substrate slippage during transfer. In another embodiment, lateral guides may be utilized to further enhance capturing the substrate along the edges of the substrate open between the inner and outer edge supports.

BRIEF DESCRIPTION OF THE DRAWINGS

A more particular description of the invention, briefly summarized above, may be had by reference to the embodiments thereof that are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, wherever possible, to designate identical elements that are common to the figures.

DETAILED DESCRIPTION

Figure 1:
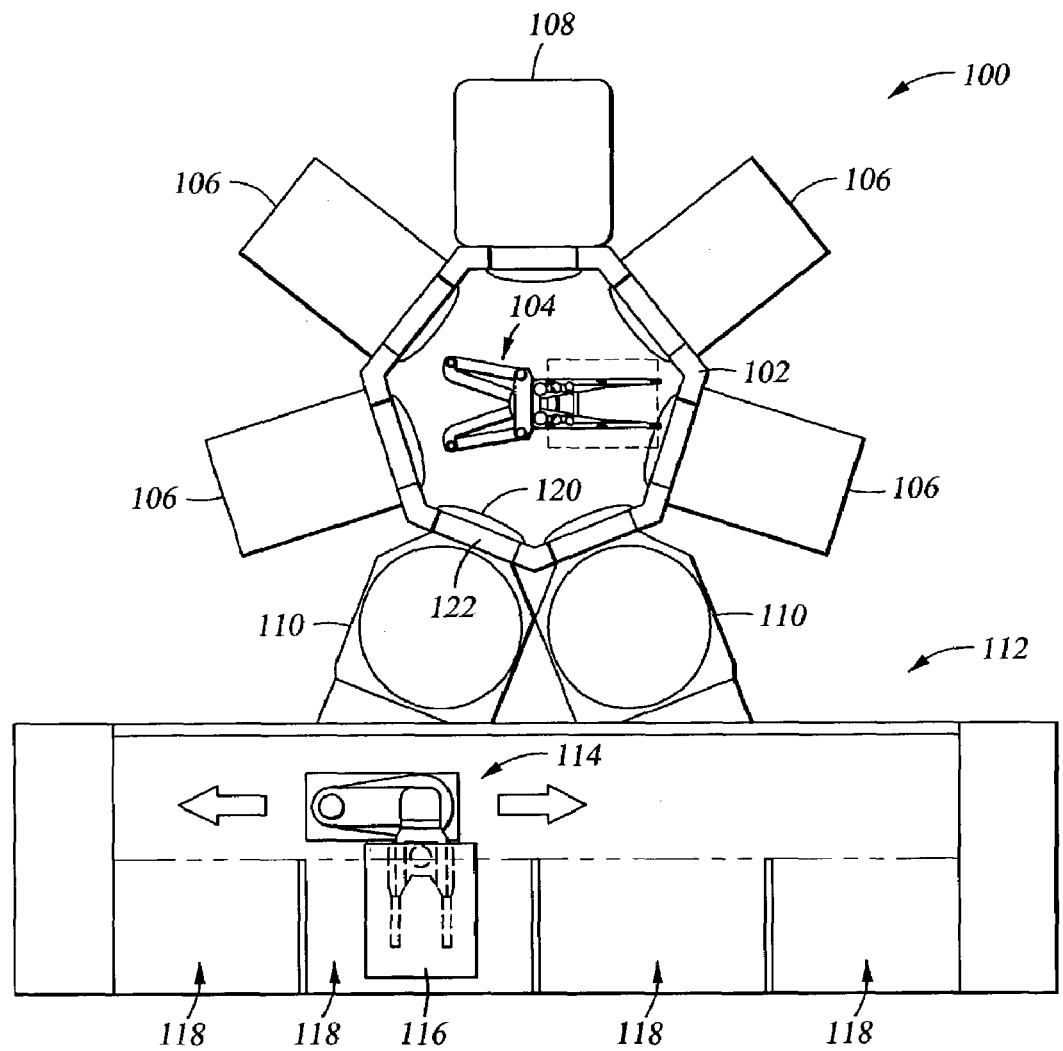
FIG. 1 is a plan view of one embodiment of a processing system.

FIG. 1 depicts a schematic layout of a cluster tool 100. The cluster tool 100 generally comprises a transfer chamber 102 having a first transfer robot 104 disposed therein. The transfer chamber 102 is surrounded by a plurality of processing chambers 106, a thermal processing chamber 108 and at least one load lock chamber 110. The load lock chambers 110, two of which are depicted in FIG. 1, are generally coupled between the transfer chamber 102 and a factory interface 112. One cluster tool that may be adapted to benefit from the invention is available from AKT, Inc., a wholly-owned division of Applied Materials, Inc., located in Santa Clara, Calif.

The factory interface 112 generally includes a second transfer robot 114 that transfers substrates 116 between the load locks 110 and a plurality of wafer storage cassettes 118 coupled to or disposed within the factory interface 112. The second transfer robot 114 may be configured similar to the first transfer robot 104 described below. The factory interface 112 is generally maintained at or near atmospheric pressure. The second transfer robot 114 is typically configured to move laterally within the factory interface 112 so substrates 116 may be transferred between the load locks 110 and the cassettes 118 with minimal handling and time expenditure.

Each load lock chamber 110 generally allows for the substrate 116 to be transferred between a sub-atmospheric environment maintained in the transfer chamber 102 and the atmospheric environment of the factory interface 112 without loss of vacuum from the transfer chamber 102. The load lock chambers 110 may be configured to transfer more than one substrate 116 at a time and may additionally heat or cool the substrates. One load lock chamber that may be used to advantage is described in U.S. patent Ser. No. 09/464,362, filed Dec. 15, 1999, which is hereby incorporated by reference in its entirety.

The transfer chamber 102 is typically fabricated from a single mass of material such as aluminum to minimize vacuum leaks. The transfer chamber 102 includes a plurality of passages 122 disposed in the walls of the chamber 102 to allow transfer of substrates therethrough. Each passage 122 is selectively sealed by an isolation valve 120. One isolation valve that may be used to advantage is described in U.S. Pat. No. 6,079,693, issued Jun. 27, 2000 to Ettinger et al., which is hereby incorporated by reference in its entirety.

The processing chambers 106 are generally disposed about the perimeter of the transfer chamber 102. The processing chambers 106 may be configured to include etch chambers, deposition chambers and/or other chambers suitable for fabricating a desired structure or device on a substrate.

The thermal processing chamber 108 generally heats or thermally treats one or more substrates 116 disposed therein. The thermal processing chamber 108 generally includes at least one substrate support (not shown) adapted to support one or more substrates 116 within the thermal processing chamber 108. The thermal processing chamber 108 additionally includes a thermal control system (also not shown), which may include lamps, resistive heaters, fluid conduits and the like, to uniformly heat substrates to about 550 degrees Celsius. One thermal processing chamber that may be used to advantage is described in U.S. patent application Ser. No. 10/025,152, filed Dec. 18, 2001, by Q. Shang, which is hereby incorporated by reference in its entirety.

The first transfer robot 104 is centrally disposed in the transfer chamber 102. Generally, the first transfer robot 104 is configured to transfer substrates 116 between the chambers 106, 108, 110 surrounding the transfer chamber 102. The first transfer robot 104 is typically configured to handle single substrates, however, robots configured to handle multiple substrates may also be utilized.

Figure 2:
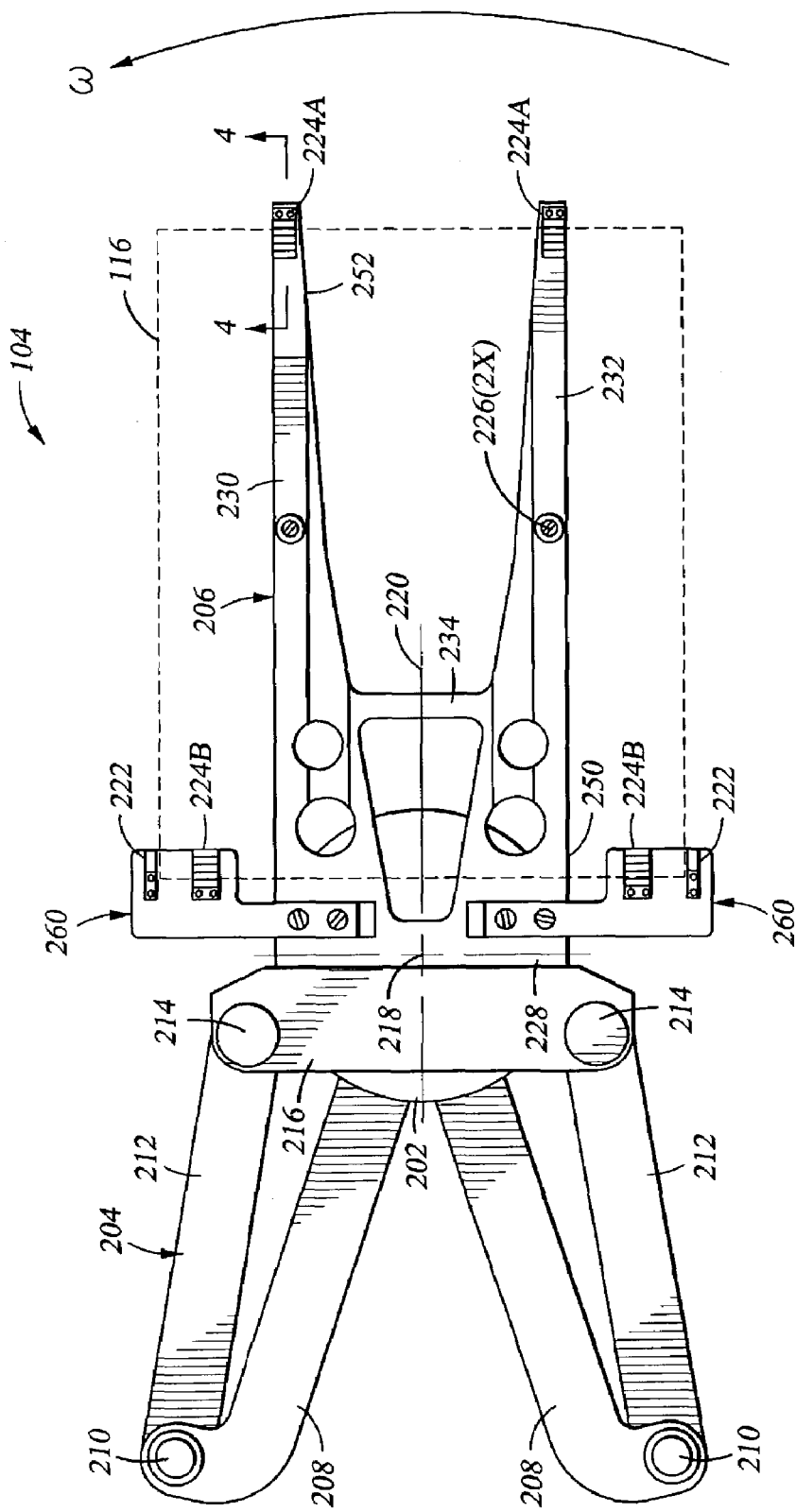
FIG. 2 is a plan view of one embodiment of a transfer robot having a plurality of substrate supports disposed on an end effector.

FIG. 2 is a plan view of one embodiment of a first transfer robot 104. The first transfer robot 104 generally comprises a robot body 202 that is coupled by a linkage 204 to an end effector 206 that supports a substrate 116 (shown in phantom) thereon. The end effector 206 may be configured to retain the substrate thereon in a desired manner, such as, for example, friction, electrostatically, vacuum chucking, clamping, edge gripping and the like. In one embodiment, the linkage 204 has a frog-leg configuration. Other configurations for the linkage 204, for example, a polar configuration may be alternatively utilized. One example of a polar robot that may benefit from the invention is described in U.S. patent Ser. No. 09/547,189, filed Apr. 11, 2000 by Ettinger et al., which is incorporated herein in its entirety.

The linkage 204 generally includes two wings 208 coupled by elbows 210 to two arms 212. Each wing 208 is additionally coupled to an electric motor (not shown) concentrically stacked within the robot body 202. Each arm 212 is coupled by a bushing 214 to a wrist 216. The wrist 216 couples the linkage 204 to the end effector 206. Typically, the linkage 204 is fabricated from aluminum, however, materials having sufficient strength and smaller coefficients of thermal expansion, for example, titanium, stainless steel, metal matrix or a ceramic such as titanium-doped alumina, may also be utilized.

Each wing 208 is independently controlled by one of the concentrically stacked motors. When the motors rotate in the same direction, the end, effector 206 is rotated at an angle ω about the centerline 218 of the robot body 202 at a constant radius. When both of the motors are rotated in opposite directions, the linkage 204 accordingly expands or contracts, thus moving the end effector 206 radially inward or outward along an imaginary datum line 220 passing through the centerline 218 of the first transfer robot 104. The first transfer robot 104 is also capable of a hybrid motion resulting from combining the radial and rotational motions simultaneously.

The end effector 206 is typically fabricated from aluminum, quartz, carbon, metal matrix or ceramic and configured to support a substrate with minimal sag. In the embodiment depicted in FIG. 2, the end effector 206 is ceramic and includes a base 228, a first member 230 and a second member 232. Each of the first and second members 230, 232 is coupled to the base 228 at a first end 250 and extends therefrom to a distal end 252. The base 228 is coupled to the wrist 216 of the first transfer robot 104. The first member 230 and the second member 232 are generally disposed in spaced-apart relation typically mirrored about the datum line 220 that bisects the base 228. The length and spacing between the first member 230 and the second member 232 is selected to adequately support the substrate during transfer while minimizing substrate sag. At least one connecting member 234 is coupled between the first member 230 and second member 232 to provide additional structural rigidity to the end effector 206.

The end effector 206 generally includes a plurality of substrate supports disposed thereon to support a substrate in a spaced-apart relation to the end effector during substrate transfer. In the embodiment depicted in FIG. 2, the end effector 206 has pair of opposing inner and outer edge supports 224A, 224B and a center support 226 disposed on each of the first and second members 230, 232 for a total of six (6) substrate supports. The inner and outer edge supports 224A, 224B have parallel opposing faces that capture the substrate 116 therebetween to substantially prevent movement of the substrate 116 relative to the end effector 206 during substrate transfer, thereby facilitating increased robot rotational speed and corresponding substrate throughput. Two lateral guides 222 may be utilized to further augment substrate retention in a direction parallel to the edge supports 224A, 224B.

The outer edge supports 224A from each opposing pair are coupled to the distal end 252 of the end effector 206. The opposing inner edge support 224B is coupled to the first end 250 of the end effector 206. The edge supports 224B may alternatively be part of a spacer assembly 260 coupled to the first end 250 of the end effector 206 utilized to position the lateral guide 222.

Figure 3:
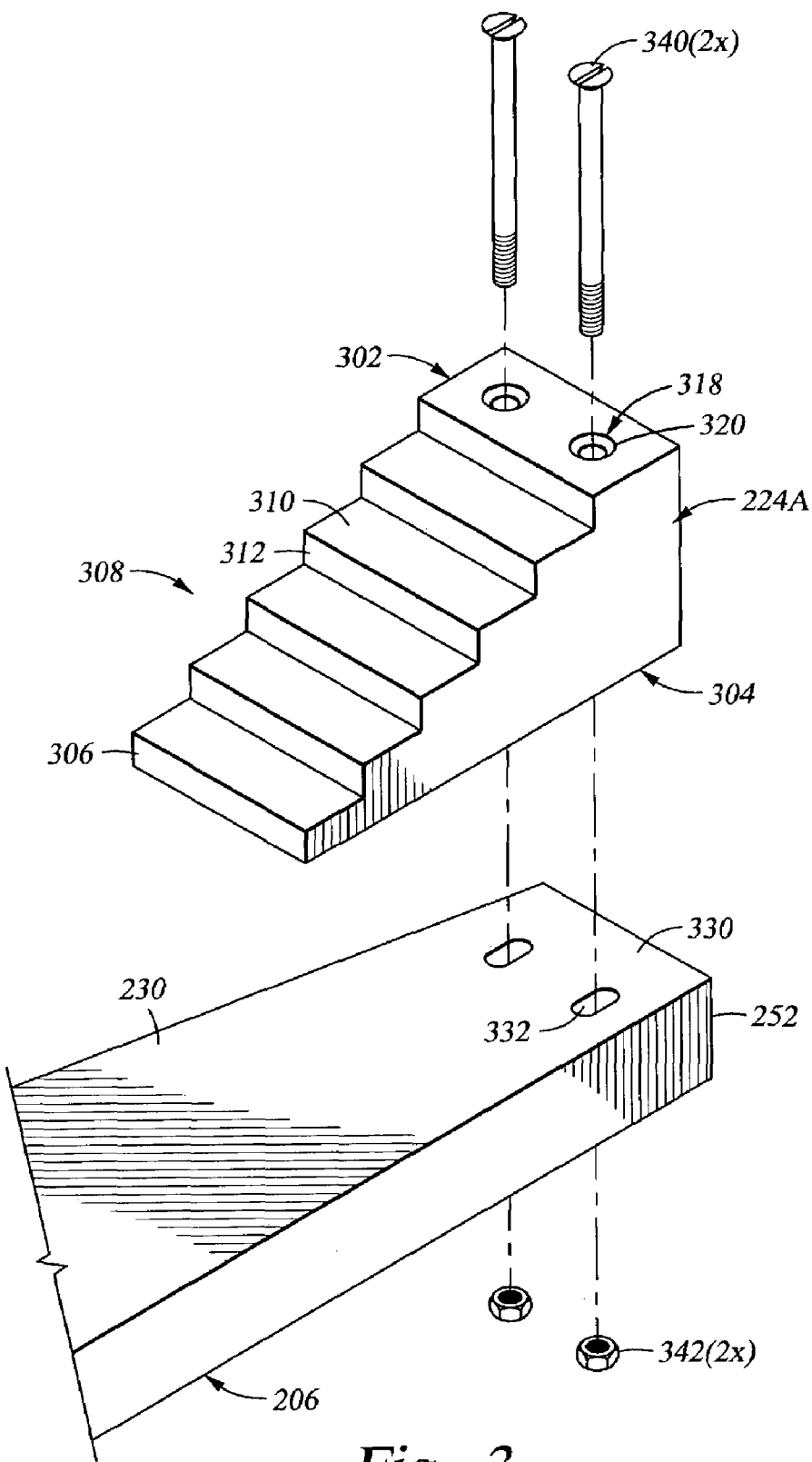
FIG. 3 is an exploded view of one embodiment of an edge support of FIG. 2.

FIG. 3 is an exploded view of one embodiment of the outer edge support 224A of FIG. 2. The inner edge support 224B may be similarly configured. The outer edge support 224A is fabricated from a material suitable for high temperature use that does not mar, scratch or otherwise contaminate the substrate 116. In one embodiment, the outer edge support 224A is fabricated from a thermoplastic material having a melting point greater than about 500 degrees Celsius, thus facilitating handling of high temperature substrates without melting or sticking of the support to the substrate. The outer edge support 224A may also have hardness less than about 150 Rockwell M. Examples of suitable thermoplastics include high performance semi-crystalline thermoplastics, polybenzimidazole and polyetheretherketone, among others. Other suitable materials include stainless steel and ceramic.

The outer edge support 224A includes a top surface 302 having a plurality of steps 308 and an opposing bottom surface 304. The bottom surface 304 is disposed on an upper surface 330 of the end effector 206. Each step 308 includes a support surface 310 and a retaining surface 312. The support surface 310 is configured to support the substrate 116 thereon and is typically oriented in a plane parallel to the upper surface 330 of the first member 230. The support surface 310 may also be patterned, textured, embossed, dimpled, slotted or otherwise include a plurality of surface features which reduce the contact area with the substrate 116 to minimize heat transfer therebetween. Some examples of patterned support surfaces are described further below with reference to FIGS. 9A-F.

The retaining surfaces 312 are generally planar and extend vertically from the support surfaces 310. Alternatively, the retaining surfaces 312 may be flared away from a first side 306 of the outer edge support 224A to provide an entrance angle that facilitates seating of the substrate 116 on the support surface 310. The retaining surface 312 is oriented parallel to and facing a retaining surface of the opposing inner edge support 224B disposed on the first member 230 to capture and retain the substrate 116 therebetween as depicted in FIG. 2.

Figure 4:
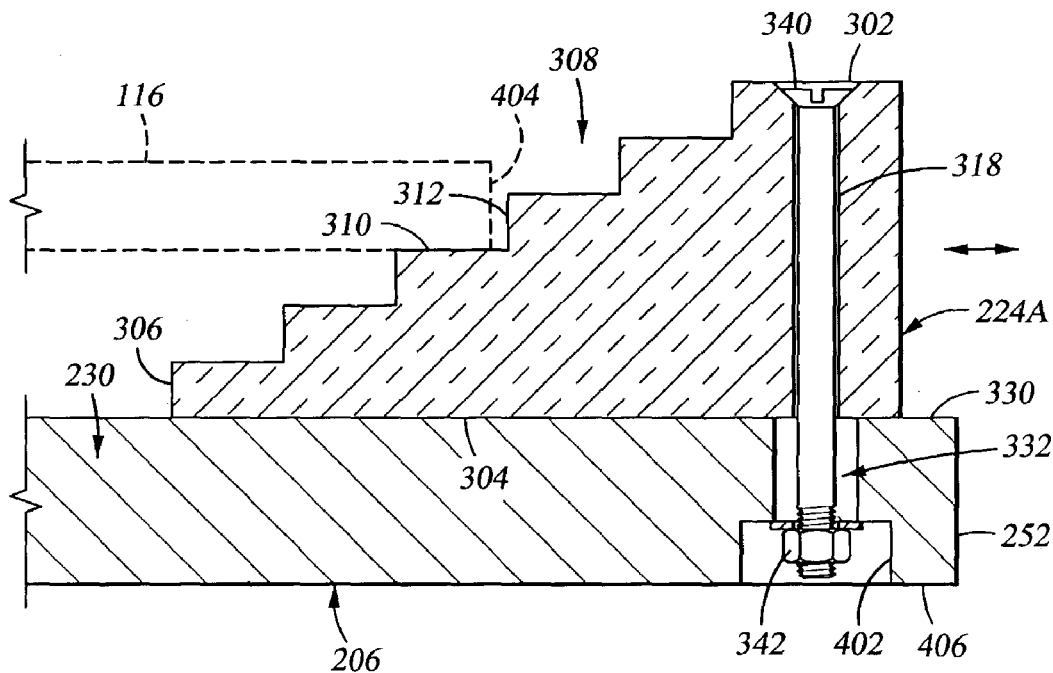
FIG. 4 is a sectional view of the edge support of FIG. 2 taken along section line 4-4.

Referring additionally to FIG. 4, the outer edge support 224A includes a plurality of mounting holes 318. A fastener 340 is disposed through each mounting hole 318 and a slot 332 formed in the first member 230 and is threaded into a nut 342 to secure the outer edge spacer 224A to the end effector 206. The slots 332 are oriented substantially perpendicular to the plane of the retaining surface 312 and parallel to the datum line 220 to facilitate adjustment of the outer edge support 224A on the end effector 206. The slots 332 allow the distance between opposing edge supports 224A, 224B to be set so that edges 404 (one is shown in FIG. 4) of the substrate 116 are captured between the retaining surfaces 312 of the steps 308 to prevent movement of the substrate 116 during substrate transfer. Alternatively, the mounting hole 318 may be elongated (i.e., slotted) to facilitate adjustment of the outer edge spacer 224A.

In one embodiment, a recess 402 is formed in a bottom surface 406 of the first member 230 to allow the nut 342 to be disposed on the distal end of the fastener 340 below the bottom surface 406 of the end effector 206. The recess 402 is configured with adequate clearance space for the nut 342 to move laterally as the fastener 340 is moved between ends of the slot 332.

Figure 5:
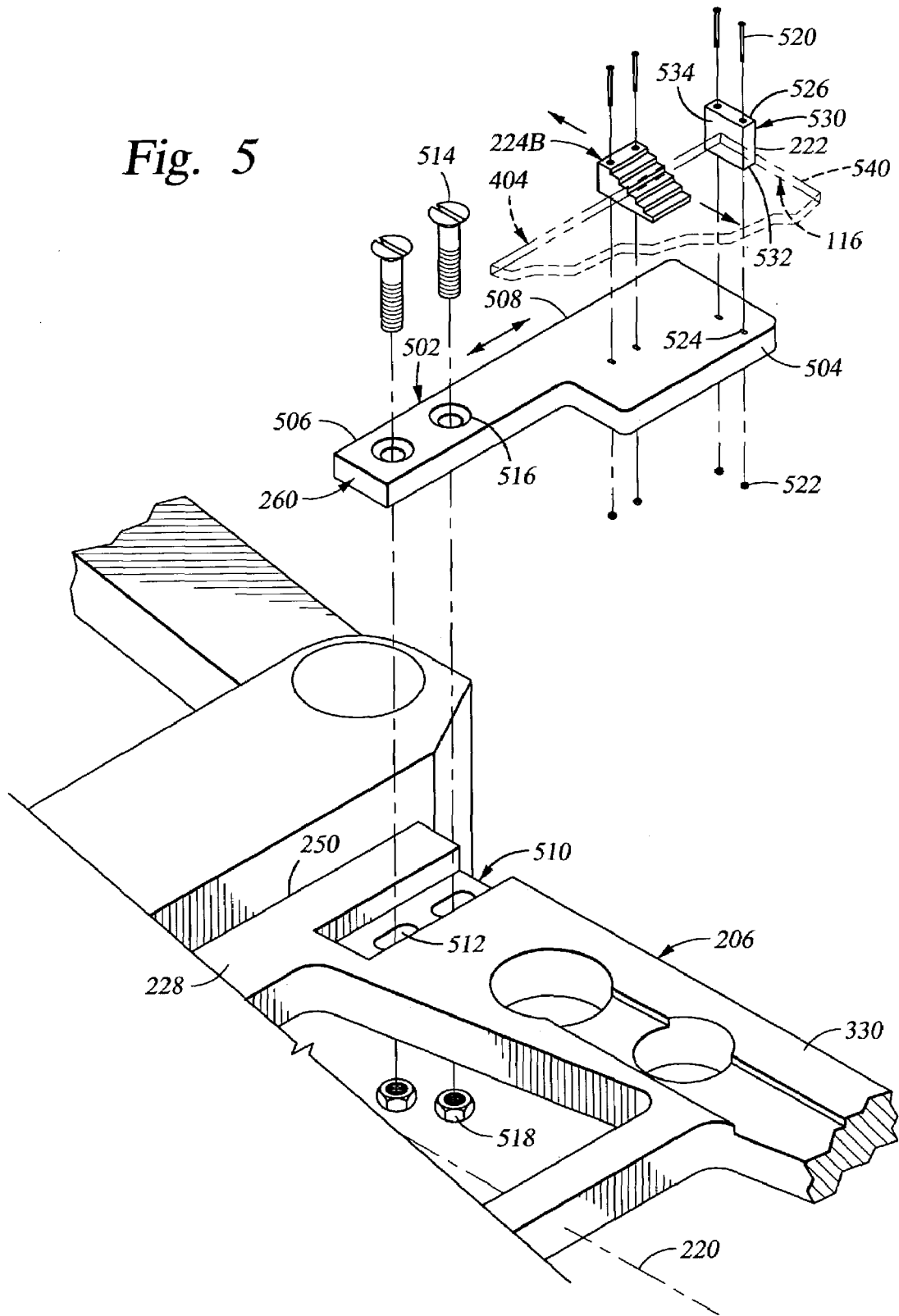
FIG. 5 is an exploded view of one embodiment of a spacer assembly of FIG. 2.

FIG. 5 is an exploded view of one embodiment of a spacer assembly 260 coupled to the end effector 206. The spacer assembly 260 includes an outrigger 502 and at least the lateral guide 222. The outrigger 502 has a first end 506 and a second end 508. A mounting pad 504 is attached to the second end 508 of the outrigger 502 and has the lateral guide 222 attached thereto. The lateral guide 222 may be coupled to the mounting pad 504 by a variety of methods, including adhering, bonding, riveting, staking, fastening and the like. The outrigger 502 is configured to position the lateral guide 222 slightly outward of a lateral edge 540 (e.g., edge of the substrate 116 perpendicular to the edge 404) thereby preventing the substrate 116 from moving laterally relative to the datum line 220 while being rotated by the robot.

The outrigger 502 is typically fabricated from the same material utilized for the end effector 206 and is coupled by first end 506 to the first end 250 of the end effector 206. In one embodiment, the first end 506 of the outrigger 502 is disposed in a channel 510 formed in the end effector 206. The channel 510 includes a plurality of slots 512 that accept fasteners 514 passing through holes 516 formed through the first end 506 of the outriggers 502. A nut 518 is mated with each fastener 514 to secure the outrigger 502 to the end effector 206. The slots 512 are oriented substantially perpendicular to the datum line 220 (shown for reference in FIG. 5) so that the position of the lateral guide 222 coupled to the outrigger 502 may be adjusted to accommodate a predefined size substrate 116 without undue clearance for tolerance stacking. Alternatively, the holes 516 may be elongated (i.e., slotted) to facilitate adjustment of the outriggers 502.

In one embodiment, the inner edge support 224B may be coupled to the mounting pad 504 adjacent the lateral guide 222. The inner edge support 224B, is generally configured to mirror the outer edge support 224A and may also be adjustable in a direction parallel to the datum line 220 so that the substrate 116 may be suitably captured therebetween.

The lateral guide 222 may be fixed relative to the mounting pad 504 or adjustable in a direction perpendicular to the datum line 220. The lateral guide 222 may be coupled to the mounting pad 504 by staking, bonding, riveting, adhering, clamping, screwing, bolting or by other methods. In the embodiment depicted in FIG. 5, a plurality of fasteners 520, pass through holes 526, 524 formed through the guide 222 and mounting pad 504 and engage a nut 522 to secure the lateral guide 222 to the mounting pad 504 of the spacer assembly 260.

The lateral guide 222 is typically fabricated from thermoplastic, stainless steel or ceramic similar to the outer edge supports 224A. The lateral guide 222 has a body 530 that includes a bottom surface 532 and a face 534. The bottom surface 532 is disposed on the mounting pad 504, typically parallel to the upper surface 330 of the end effector 206. The face 534 extends from the bottom surface 534 and is oriented parallel to the datum line 220 and perpendicular to the plane of the end effector 206 and substrate 116.

Referring additionally to FIG. 2, the face 534 is configured to interface with the lateral edge 540 of the substrate 116 so that the substrate is laterally restrained between the faces 532 of lateral guides 222 disposed on opposing spacer assemblies 260. In one embodiment the face 534 is substantially parallel to a plane defined by the datum line 220 and the centerline 218 of the transfer robot 104. The face 534 may alternatively be angled into the body 530 from the bottom surface 534 to facilitate entry of the substrate between the faces 534 of opposing lateral guides 222.

Figure 6:
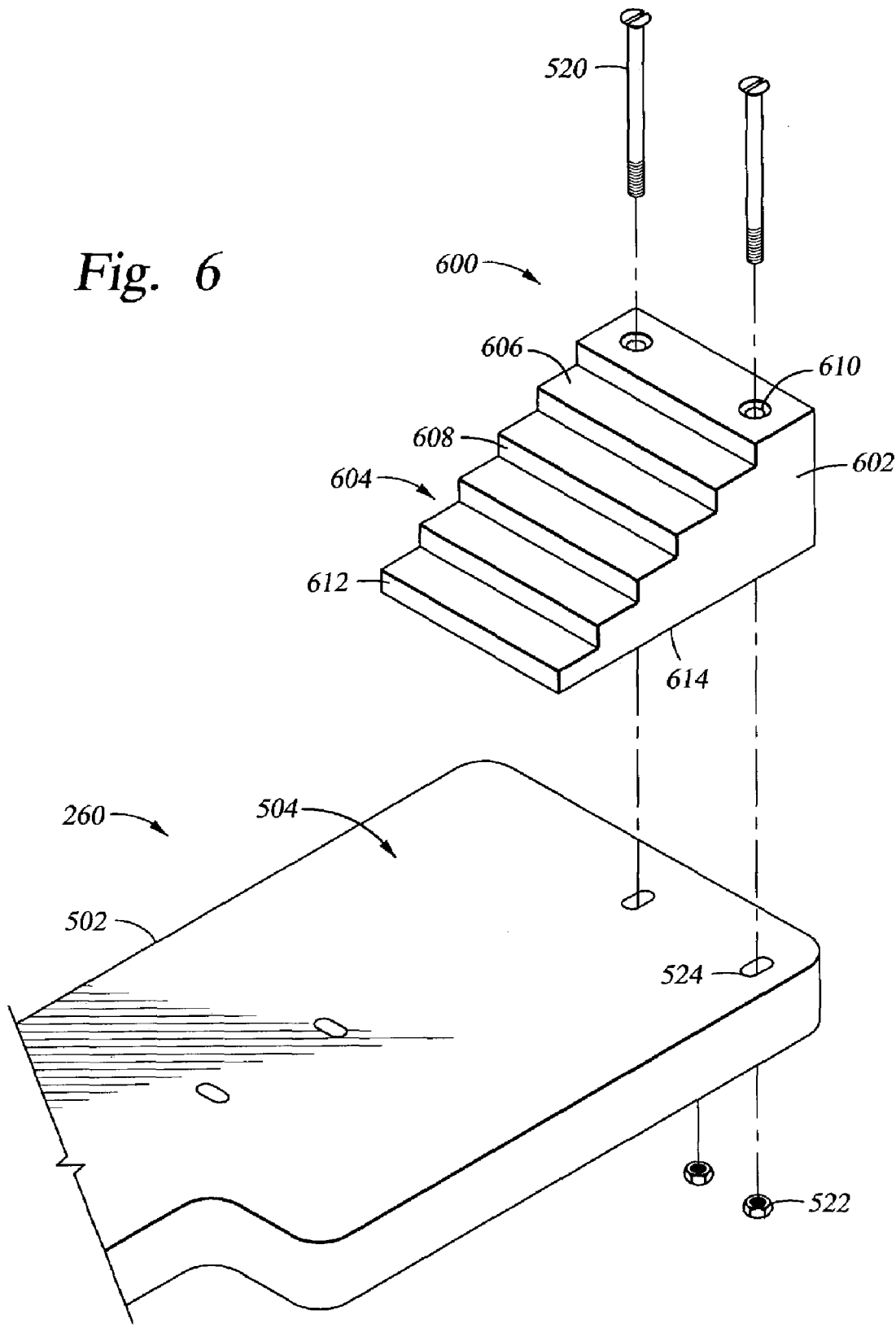
FIG. 6 is a partial exploded view of the spacer assembly of FIG. 5 having alternative embodiment of a lateral guide.

FIG. 6 is an exploded view of another embodiment of a lateral guide 600 that may be utilized with the spacer assembly 260 in place of the lateral guide 222. The lateral guide 600 has a body 602 that includes a bottom surface 614 and a face 612.

The bottom surface 614 is disposed on the mounting pad 504, typically parallel to the upper surface 330 of the end effector 206. A plurality of fasteners 520 are disposed through holes 610, 524 formed through the body 602 and mounting pad 504 and engage nuts 522 to secure the lateral guide 600 to the mounting pad 504.

The face 612 extends from the bottom surface 614 and is oriented parallel to the datum line 220 and perpendicular to the plane of the end effector 206 and substrate 116. The face 612 includes a plurality of steps 604 facing the datum line 220. The steps 604 include a support surface 606 and a retaining surface 608. The support surface 606 is oriented parallel to the plane of the end effector 206 and datum line 220 and is adapted to support the substrate thereon.

The retaining surface 608 extends upward from the support surface 606 and is oriented parallel to the plane defined by the centerline 218 (shown in FIG. 2) and datum line 220. The retaining surface 608 of the face 612 is configured to capture of the substrate 116 against an opposing face 612 of a lateral guide (not shown) disposed on the opposite side of the datum line 220 to prevent the substrate from moving during substrate transfer.

Figure 7:
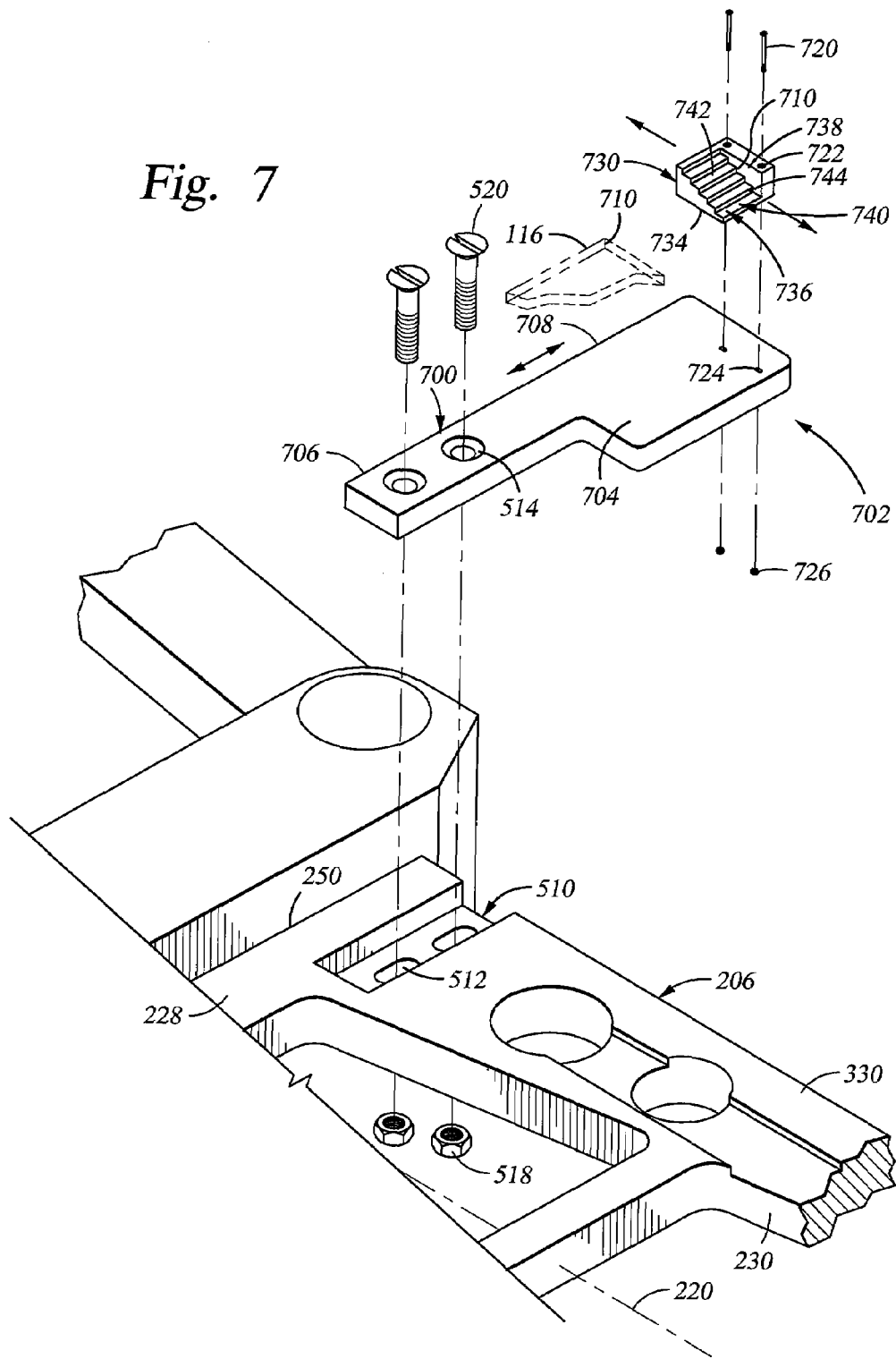
FIG. 7 is a perspective view of another embodiment of a spacer assembly.

FIG. 7 is a perspective view of another embodiment of a spacer assembly 700. The spacer assembly 700 includes an outrigger 702 and a substrate support 730. The outrigger 702 has a first end 706 and a second end 708 attached to a mounting pad 704. The outrigger 702 is configured to position the substrate support 730 to interface with a corner 710 of the substrate 116 thereby preventing the substrate 116 from shifting on the end effector 206 while the substrate is moved by the robot 104.

The substrate support 730 includes a generally "L" shaped body 732 having a bottom surface 734, a first interior face 736 and a second interior face 738. The bottom surface 734 is disposed on the mounting pad 704. The first interior face 736 includes a plurality of steps 740. Each step 740 includes a support surface 742 and a retaining surface 744. The support surface 742 is configured to support the substrate 116 thereon and is typically oriented in a plane parallel to the mounting pad 704 and upper surface 330 of the end effector 206. The support surface 742 may also be textured, embossed, dimpled, slotted or otherwise include a plurality of surface features as discussed with reference to FIGS. 9A-F described further below.

The retaining surface 744 extends vertically relative to the mounting pad 504. Alternatively, the retaining surface 744 may be flared to provide an entrance angle that facilitates seating of the substrate 116 on the support surface 742. The substrate 116 is laterally captured on the end effector 206 between the retaining surface 744 and the outer edge support 224A (shown in FIG. 2) as the substrate is rotated about the centerline 218 of the transfer robot 104.

The second interior face 738 is generally oriented parallel of the plane defined by the center and datum lines 218, 220, and is also perpendicular to the support and retaining surfaces 742, 744. The second interior face 738 may alternatively be flared to enhance entry of the substrate 116 between second interior faces disposed on opposing spacer assemblies 700. In another embodiment, the second interior face 738 may include plurality of steps similar to the steps similar to those described with reference to the lateral guide 600 discussed above.

The first end 706 of the outrigger 702 is disposed in a channel 510 formed in the end effector 206. The channel 510 includes a plurality of slots 512 that accept fasteners 520 passing through holes 514 formed through the first end 706 of the outrigger 702. A nut 518 is mated with each fastener 520 to secure the outrigger 702 to the end effector 306. The slots 512 are oriented substantially perpendicular to the datum line 220 so that the position of the second face 738 of the substrate support 730 may be adjusted to accommodate the width of the substrate 116 within a predefined tolerance without undue close part tolerances.

The substrate support 730 is coupled to the mounting pad 704 in a manner allowing adjustment in a direction parallel to the datum line 220. In one embodiment, the mounting pad 704 includes a plurality of slots 724 having an orientation parallel to the datum line 220. A plurality of fasteners 720 are disposed through a hole 722 formed through the substrate support 730 and pass through a respective one of the slots 724. A nut 726 is threaded onto each fastener 720. The substrate support 730 may be positioned relative to the mounting pad 704 as the fasteners 720 may move laterally in the slots 724 to a predetermined position along a direction parallel to the datum line 220, the nut 726 is tightened to secure the substrate support 730 to the mounting pad 704 of the spacer assembly 700.

Figure 8:
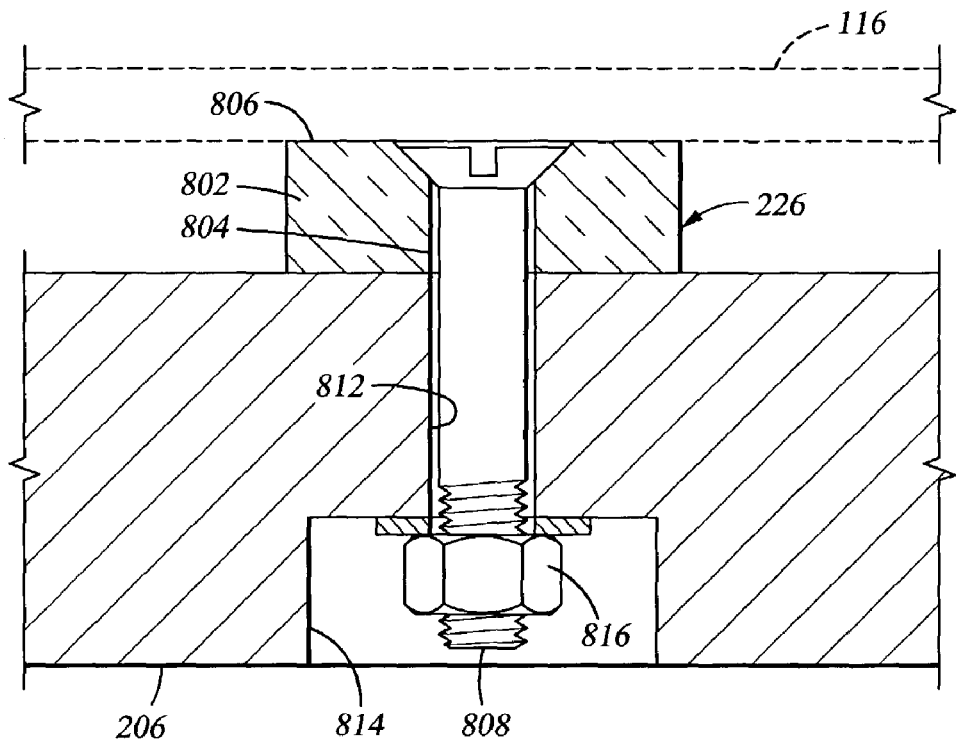
FIG. 8 is a sectional view of one embodiment of a center support of FIG. 2 taken along section line 9-9.

FIG. 8 depicts one embodiment of the center support 226. The center support 226 generally includes an annular body 802 having mounting hole 804 disposed therethrough. The center support 226 is fabricated from materials similar to that utilized for the outer edge support 224A described above. The center support 226 has a support surface 806 typically utilized to support a center region of a substrate.

A fastener 808 is disposed through a hole 812 defined through the end effector 206. The fastener 808 may be a screw, rivet, dowel pin, spring pin or other retaining device. In the embodiment depicted in FIG. 8, the fastener 808 mates with a threaded nut 816 disposed on the lower surface of the end effector 206. The lower surface of the end effector 206 may include a recess 814 to allow the nut 816 and fastener 808 to remain flush or recessed from the exterior of the end effector 206. The support surface 806 may be textured to minimize heat transfer between the substrate 116 and center support 226.

FIGS. 9A-F depict various embodiments of a patterned support surface that minimizes contact area available for heat transfer with the substrate. By minimizing the contact area of the support surface available for heat transfer, the hot substrate will not heat the support surface as quickly as pads having a contact area comprising the entire top surface. Although FIGS. 9A-F depict a few exemplary patterns for reducing the contact area between the support surface and substrate supported thereon, other patterns are contemplated and considered within the scope of the invention claimed below. Utilization of a patterned support surface is particularly advantageous when the support surface is fabricated from a polymer.

Figure 9A:
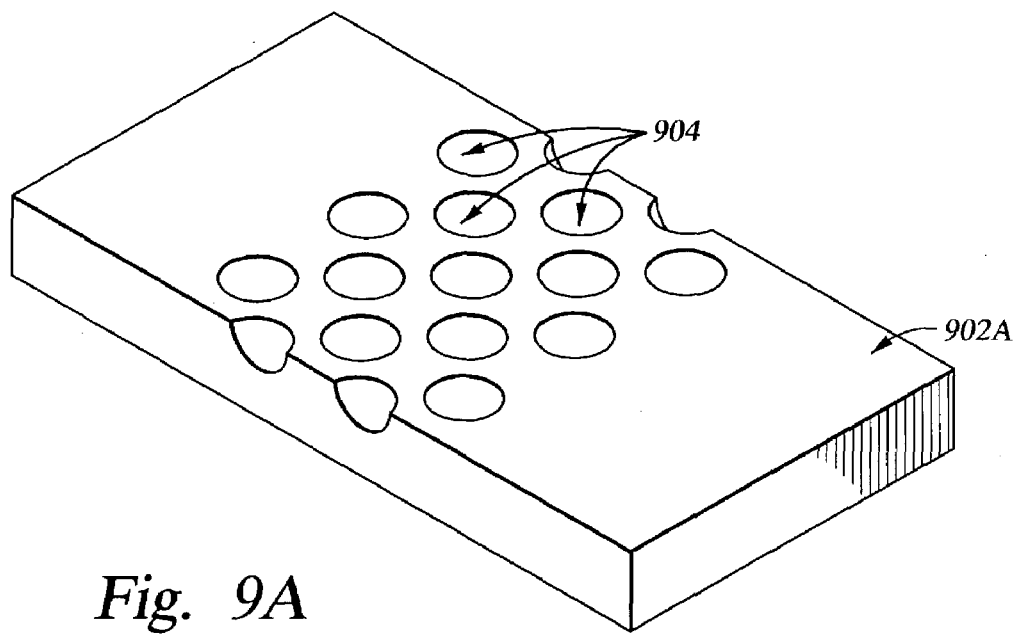
FIGS. 9A-F depict perspective top views of various embodiments of a patterned support surface.

FIG. 9A depicts a perspective view of a patterned support surface 902A. The support surface 902A comprises a plurality of dimples 904 formed therein. The dimples 904 may have any geometric configuration and may be disposed on the top surface 902A in a symmetrical, regular (i.e., equally spaced) or random pattern. The dimples 904 extend below a plane of the support surface 902A thereby reducing the contact area of the support surface 902A with the substrate.

Figure 9B:
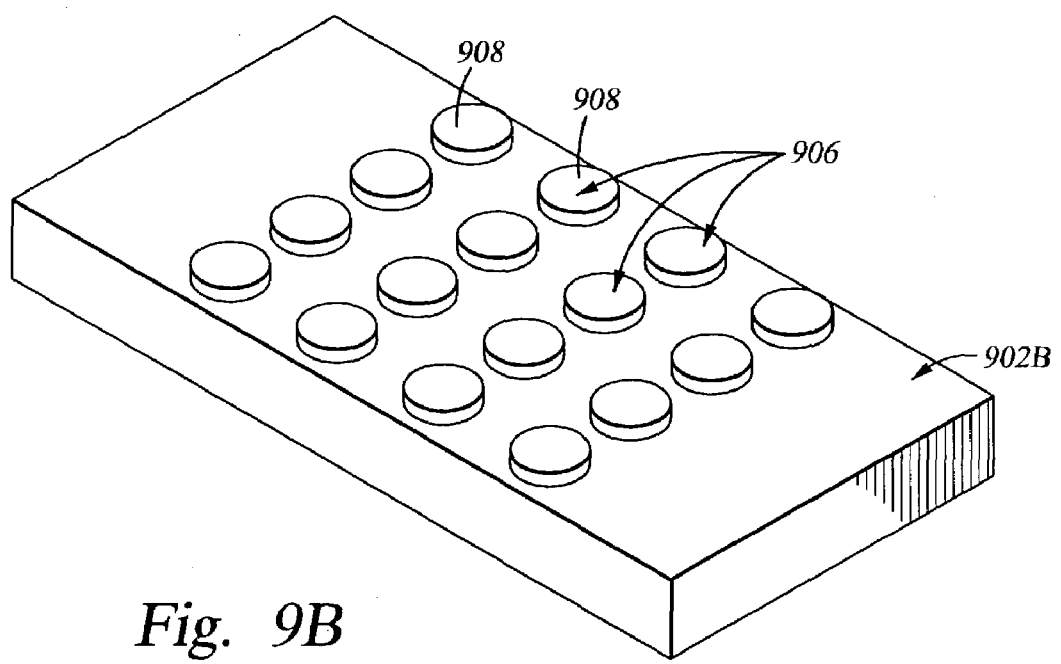

In the embodiment depicted in FIG. 9B, a patterned support surface 902B includes a plurality of protrusions 906 extending from the support surface 902B. The protrusions 906 may have any geometric configuration and may be disposed on the support surface 902B in a symmetrical, regular (i.e., equally spaced) or random pattern. Each protrusion 906 has a top 908 that lies on a common plane that supports a substrate seated thereon. The top 908 may be flat as shown, curved or pointed. As the substrate is seated on the protrusions 906, the contact area of the support surface 902B with the substrate is reduced.

Figure 9C:
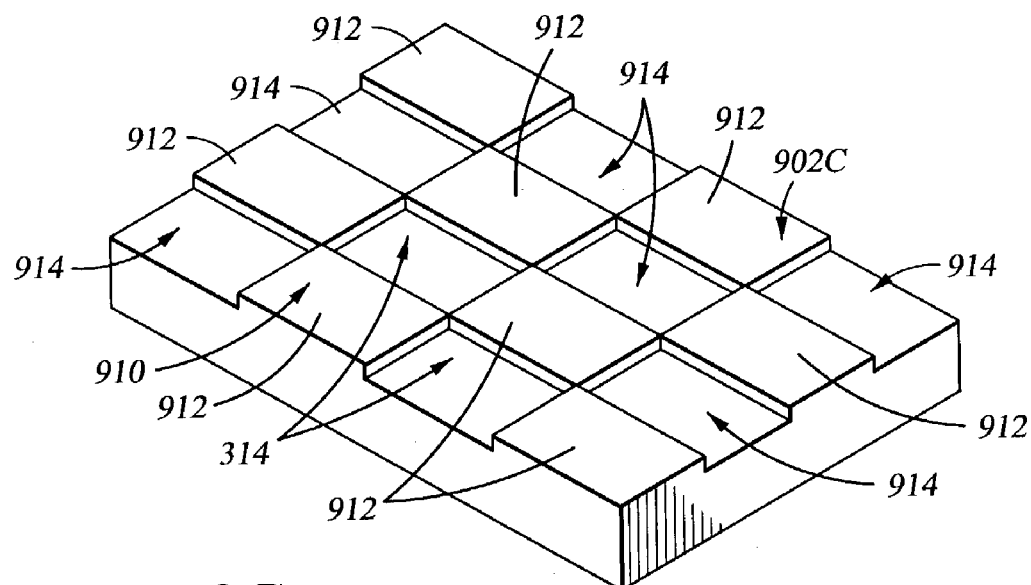

In the embodiment depicted in FIG. 9C, a patterned support surface 902C includes a grid 910 extending from the support surface 902C. The grid 910 generally comprises a web of projecting support members 912 that may have any geometric configuration and may be disposed on the support surface 902C in a symmetrical, regular (i.e., equally spaced) or random pattern. The support member 912 generally project to a common plane that supports a substrate seated thereon and defines a recessed area 914 therebetween. As the substrate is seated on the support members 912 of the grid 910, the contact area of the support surface 902C is reduced.

Figure 9D:
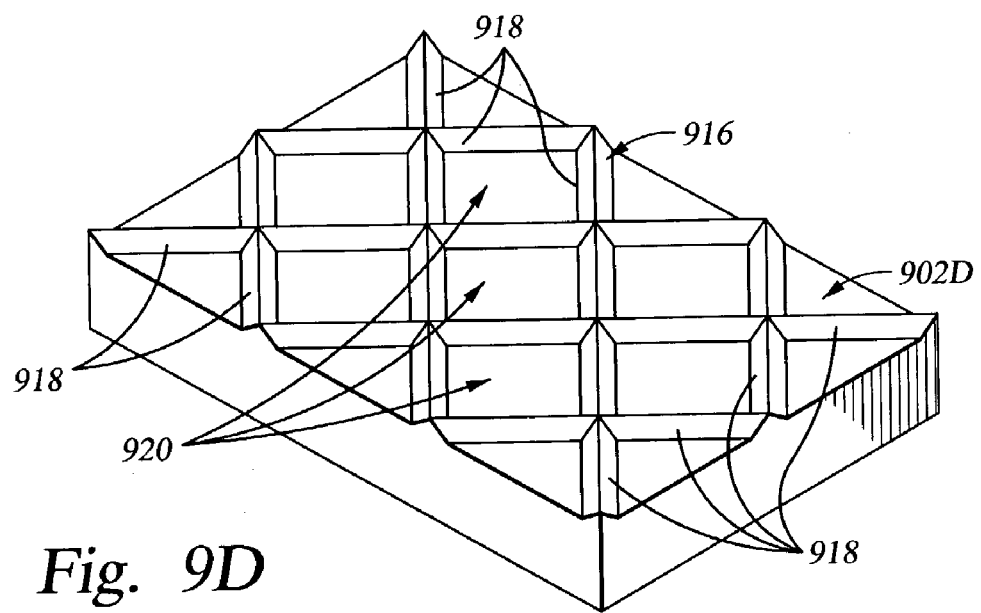

In the embodiment depicted in FIG. 9D, a patterned support surface 902D includes a mesh 916 extending from the support surface 902D. The mesh 916 generally comprises a plurality of intersecting ridges 918 that project from the support surface 902D. The ridges 918 may intersect at any angle and may be linear, curved or complex in form. The ridges 918 may be disposed on the support surface 902C in a symmetrical, regular (i.e., equally spaced) or random pattern. The ridges 918 generally project to a common plane that supports a substrate seated thereon and defines a recessed area 920 therebetween. As the substrate is seated on the ridges 918 of the mesh 916, the contact area of the support surface 902D is reduced.

Figure 9E:
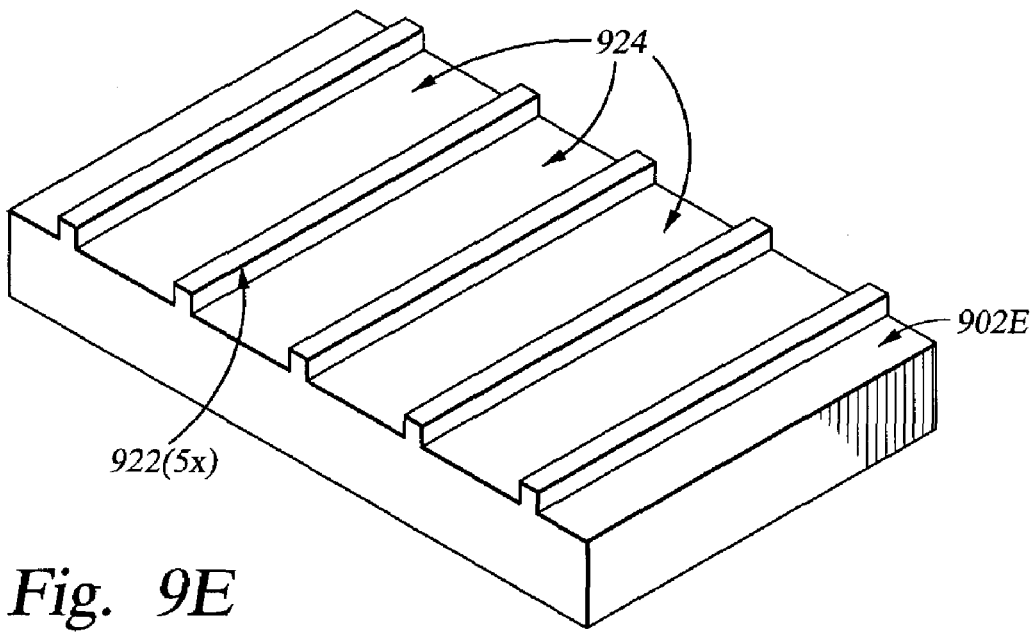

In the embodiment depicted in FIG. 9E, a patterned support surface 902E includes a plurality of ridges 922 extending from the support surface 902E. The ridges 922 generally project from the support surface 902E and may be linear, curved or complex in form. The ridges 922 may be disposed on the support surface 902E in a symmetrical, regular (i.e., equally spaced) or random pattern. The ridges 922 generally project to a common plane that supports a substrate seated thereon and defines a recessed area 924 therebetween. As the substrate is seated on the ridges 922, the contact area of the support surface is reduced.

Figure 9F:
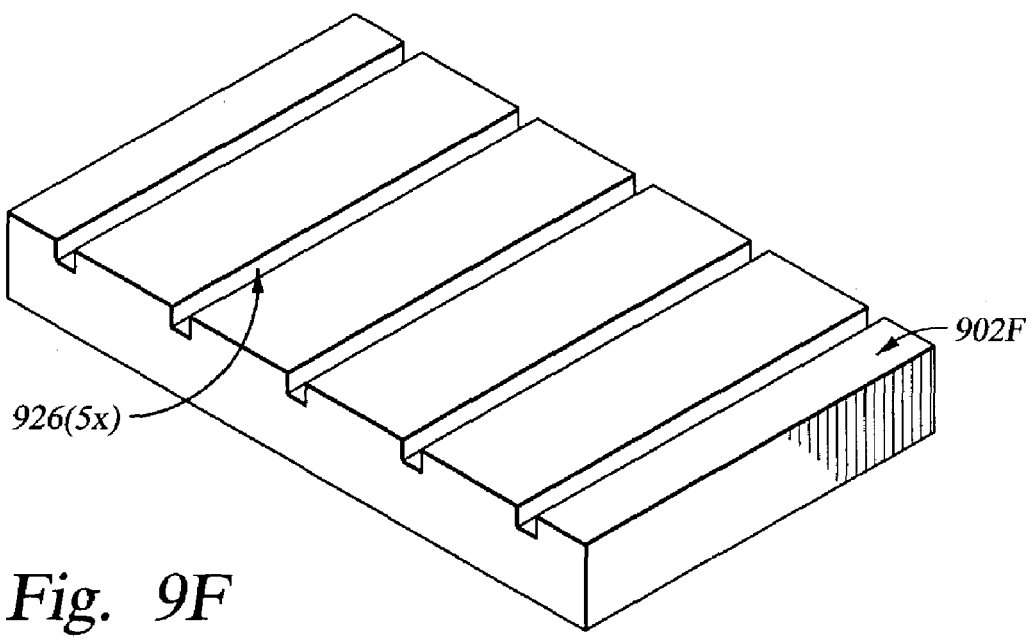

In the embodiment depicted in FIG. 9F, a patterned support surface 902F includes a plurality of grooves 926 form in the top surface 902F. The grooves 926 generally project into the support surface 902F and may interest, be linear, curved or complex in form. The grooves 926 may be disposed on the support surface 902F in a symmetrical, regular (i.e., equally spaced) or random pattern. The grooves 926 reduce the surface area of the support surface 902F that supports a substrate seated thereon, thereby reducing the contact area available for heat transfer.

Thus, the inventive substrate supports substantially reduce or eliminate pad material sticking to the substrate after repeated cycling. Reducing and eliminating contamination of the substrate by the substrate supports correspondingly increases device yield. Moreover, the inventive edge supports capture the substrate therebetween to substantially eliminate substrate movement relative to the end effector during substrate transfer. Additionally, using lateral guides that bound the substrate on the edges adjacent the edge supports further enhances retaining the substrate on the end effector thereby allowing greater robot rotational speed that enhance substrate throughput.

While the foregoing is directed to embodiments of the present invention, other future embodiments of this invention may be revised without departing from the basic scope thereof, and the scope thereof is determined by the claims that follow.

What is claimed is:

1. An end effector assembly for supporting a quadrilateral substrate during substrate transfer, the end effector assembly comprising:
    an end effector having a first end, adapted for coupling to a robot linkage, and a distal end;
    a spacer assembly coupled to the first end of the end effector;
    a patterned inner edge support connected to the first end of the end effector by the spacer assembly and having a face; and
    a patterned outer edge support disposed on the distal end of the end effector and having a face fixed in an orientation parallel to and facing the face of the inner edge support wherein the face of the outer edge support has a plurality of steps and each of the steps has a vertical surface and a patterned horizontal surface adapted to support the substrate.

2. The end effector assembly of claim 1, wherein the outer edge support is fabricated from a thermoplastic material having a melting point greater than about 500 degrees Celsius and a Rockwell M hardness less than about 150.

3. The end effector assembly of claim 1, wherein the distal end of the end effector further comprises a plurality of slots adapted for accepting fasteners disposed through the outer edge support.

4. The end effector assembly of claim 3, wherein the slots are orientated perpendicular to the vertical face of the steps in the outer edge support.

5. The end effector assembly of claim 1, wherein the end effector further comprises:
    a base disposed at the first end and having a datum line passing therethrough;
    a first member extending from one side of the base to the distal end of the end effector; and
    a second member extending from an opposite side of the base to the distal end of the end effector and mirroring the first member about the datum line.

6. The end effector assembly of claim 5, wherein the patterned outer edge support is disposed on the distal end of the first member; and
    a second outer edge support is disposed on the distal end of the second member.

7. The end effector assembly of claim 5 further comprising:
    a second outer edge support disposed on the distal end of the second member and
    a second inner edge support connected to the first end of the end effector by a second spacer assembly in a position relative to the first inner edge support that mirror about the datum line.

8. The end effector assembly of claim 7, wherein the second outer edge support has a face coplanar with the face of the patterned outer edge support; and
    the second inner edge support has a face coplanar with the face of the patterned inner edge support.

9. The end effector assembly of claim 1 further comprising:
    a first lateral guide disposed on the spacer assembly coupled to the end effector and having a face; and
    a second lateral guide disposed on a second spacer assembly coupled to the end effector and having a face oriented towards and parallel to a face of the first lateral guide, the faces of the first lateral guide, the second lateral guide, the patterned inner edge support and the patterned outer edge support to retain a quadrilateral substrate.

10. The end effector assembly of claim 1 further comprising:
    a first lateral guide disposed on the spacer assembly coupled to the end effector and having a face oriented perpendicular to the face of the patterned outer edge support.

11. The end effector assembly of claim 1, wherein the spacer assembly further comprises:
    an outrigger having a first end coupled to the end effector and a second end having the first lateral guide disposed thereon, wherein the second end of the outrigger is oriented outward of the first end relative to a datum line bisecting the end effector.

12. The end effector assembly of claim 11, wherein the first lateral guide is adjustable in position relative to the datum line.

13. An end effector assembly for supporting a quadrilateral substrate during substrate transfer, the end effector assembly comprising:
    an end effector having a first end, adapted for coupling to a robot linkage, and a distal end;
    a spacer assembly coupled to the first end of the end effector;
    a patterned inner edge support connected to the first end of the end effector by the spacer assembly and having a face;
    a patterned outer edge support disposed on the distal end of the end effector and having a face fixed in an orientation parallel to and facing the face of the inner edge support;

a first lateral guide coupled to the end effector and having a face oriented perpendicular to the face of the patterned outer edge support; and the spacer assembly further comprising:

an outrigger having a first end coupled to the end effector and a second end having the first lateral guide disposed thereon, wherein the second end of the outrigger is oriented outward of the first end relative to a datum line bisecting the end effector, and wherein the at least one of the outriggers or the end effector further comprises a plurality of slots orientated substantially perpendicular to the datum line adapted for accepting a fastener coupling the outrigger and the end effector.

14. The end effector assembly of claim 13, wherein the face of the first lateral guide further comprises:
a plurality of steps.

15. The end effector assembly of claim 13, wherein the inner edge support further comprises:
a surface extending normally from an outer side of the face of the inner edge support towards the outer edge support.

16. The end effector assembly of claim 15, wherein the surface of the inner edge support further comprises:
a plurality of steps.

17. The end effector assembly of claim 13, wherein the inner edge support is coupled to the second end of the outrigger.

18. An end effector assembly for supporting a quadrilateral substrate during substrate transfer, the end effector assembly comprising:

an end effector having a first end, adapted for coupling to a robot linkage, and a distal end;

a spacer assembly coupled to the first end of the end effector;

a patterned inner edge support coupled to the first end of the end effector by the spacer assembly and having a face;

a patterned outer edge support disposed on the distal end of the end effector and having a face fixed in an orientation parallel to and facing the face of the inner edge support; and the spacer assembly further comprising:

an outrigger having a first end coupled to the end effector and a second end having the inner edge support disposed thereon, wherein the second end of the outrigger is oriented outward of the first end relative to a datum line bisecting the end effector, wherein the second end of the outrigger is adjustable in a direction perpendicular to the datum line and the inner edge support is adjustable relative the outrigger in a direction parallel to the datum line.

19. An end effector assembly for supporting a substrate having a quadrilateral plane form during transfer, the end effector assembly comprising:

a) an end effector comprising:
a base;
a first member extending from one side of the base member to a distal end; and
a second member extending from the opposite side of the base member to a distal end, the first member and second member having a mirrored orientation relative to a datum line passing through the base;

b) a first outer edge support coupled to the distal end of the first member and having a plurality of steps, each of the steps having a patterned substrate support surface and a retaining surface extending upward from the substrate support surface the retaining surface oriented perpendicular to the datum line;

c) a second outer edge support coupled to a distal end of the second member and having a plurality of steps, each of the steps having a patterned substrate support surface and a retaining surface extending upward from the substrate support surface, the retaining surface coplanar with the retaining surface of the first outer edge support;

d) a first spacer assembly coupled to the first end of the end effector;

e) a first inner edge support coupled to the first end of the end effector by the first spacer assembly and having a patterned substrate support surface and a retaining surface facing an opposite direction of the retaining surface of the second outer edge support; and f) a second inner edge support coupled to the first end of the end effector by a second spacer assembly and having patterned substrate support surface and a retaining surface coplanar with the retaining surface of the first inner edge support, wherein the first and the second outer edge support each has a face fixed in an orientation parallel to and facing a face of both the first inner edge support and the second inner edge support.

20. The end effector assembly of claim 19 further comprising:
a lateral guide disposed on the first spacer assembly coupled to the end effector and having a face oriented parallel to the datum line.

21. The end effector assembly of claim 20, wherein the spacer assembly further comprises:
an outrigger having a first end coupled the end effector and a second end having the first lateral guide disposed thereon, wherein the second end of the outrigger oriented outward of the first member relative to the datum line.

22. The end effector assembly of claim 21, wherein the at least one of the outrigger or the end effector further comprises a plurality of slots orientated substantially perpendicular to the datum line adapted for accepting a fastener coupling the outrigger and the end effector.

23. The end effector assembly of claim 20, wherein the first lateral guide is adjustable in position relative to the datum line.

24. The end effector assembly of claim 20, wherein the face of the first lateral guide further comprises:
a plurality of steps.

25. The end effector assembly of claim 19, wherein the first inner support further comprises:
a surface extending from an outer side of the face of the first inner support towards the first outer support and parallel to the datum line.

26. The end effector assembly of claim 25, wherein the surface of the first inner support further comprises:
a plurality of steps.

27. The end effector assembly of claim 26, wherein the spacer assembly further comprises:
an outrigger having a first end coupled the end effector and a second end having the first inner support disposed thereon, wherein the second end of the outrigger oriented outward of the first member relative to the datum line.

28. The end effector assembly of claim 27, wherein the second end of the outrigger is adjustable in a direction perpendicular to the datum line; and
the first inner support is adjustable relative the outrigger in a direction parallel to the datum line.

29. The end effector assembly of claim 19, wherein the outer edge support is fabricated from a thermoplastic material having a melting point greater than about 500 degrees Celsius and a Rockwell M hardness less than about 150.

30. The end effector assembly of claim 19, wherein the outer edge support is fabricated from at least one of stainless steel or ceramic.

* * * * *

UNITED STATES PATENT AND TRADEMARK OFFICE
CERTIFICATE OF CORRECTION

PATENT NO. : 7,641,247 B2   Page 1 of 1
APPLICATION NO. : 10/321826
DATED : January 5, 2010
INVENTOR(S) : Blonigan et al.

It is certified that error appears in the above-identified patent and that said Letters Patent is hereby corrected as shown below:

Column 6, Line 23, please delete "534" after surface and insert --532-- therefor;

Column 6, Line 28, please delete "532" and insert --534-- therefor;

Column 6, Line 33, please delete "534" and insert --532-- therefor;

Column 10, Claim 7, Line 17, please insert --;-- after member;

Column 11, Claim 19, Line 60, please insert --,-- before the.

Signed and Sealed this

Twenty-third Day of February, 2010

David J. Kappos
*Director of the United States Patent and Trademark Office*